US011393702B2

(12) United States Patent
Takaki et al.

(10) Patent No.: US 11,393,702 B2
(45) Date of Patent: Jul. 19, 2022

(54) HEAT TREATMENT APPARATUS AND HEAT TREATMENT METHOD

(71) Applicant: Tokyo Electron Limited, Tokyo (JP)

(72) Inventors: Shinsuke Takaki, Koshi (JP); Yasuhiro Kuga, Koshi (JP); Yukinobu Otsuka, Koshi (JP); Shinichi Sagara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 16/904,802

(22) Filed: Jun. 18, 2020

(65) Prior Publication Data

US 2021/0005468 A1 Jan. 7, 2021

(30) Foreign Application Priority Data

Jul. 1, 2019 (JP) .............................. JP2019-122961

(51) Int. Cl.
| | | |
|---|---|---|
| *H01L 21/683* | (2006.01) | |
| *H01L 21/67* | (2006.01) | |
| *F27B 17/00* | (2006.01) | |
| *F27D 3/00* | (2006.01) | |

(52) U.S. Cl.
CPC .... *H01L 21/67017* (2013.01); *F27B 17/0025* (2013.01); *F27D 3/0084* (2013.01); *H01L 21/67103* (2013.01); *H01L 21/6838* (2013.01)

(58) Field of Classification Search
CPC ........... F27B 17/0025; H01L 21/67098; H01L 21/67103; H01L 21/6838; H01L 21/67107; F27D 5/00; F27D 5/006; H05B 3/68; H05B 3/06; H05B 3/748
See application file for complete search history.

(56) References Cited

U.S. PATENT DOCUMENTS

| | | | | | |
|---|---|---|---|---|---|
| 4,943,235 | A | * | 7/1990 | Nakao .................... | C30B 33/005 432/205 |
| 5,330,577 | A | * | 7/1994 | Maeda ................. | C23C 16/4407 118/722 |
| 5,534,073 | A | * | 7/1996 | Kinoshita ............. | C23C 16/455 118/728 |
| 8,286,576 | B2 | * | 10/2012 | Tamada .............. | H01L 21/6715 118/72 |
| 11,107,716 | B1 | * | 8/2021 | Sen ......................... | H01L 23/60 |
| 2018/0163306 | A1 | * | 6/2018 | Swaminathan ..... | C23C 16/4586 |
| 2020/0312623 | A1 | * | 10/2020 | Moyama ............. | C23C 16/4409 |

(Continued)

FOREIGN PATENT DOCUMENTS

| | | | |
|---|---|---|---|
| JP | 2016-115919 A | | 6/2016 |
| KR | 2006085475 | * | 7/2006 |

*Primary Examiner* — Gregory A Wilson (74) *Attorney, Agent, or Firm* — Posz Law Group, PLC (57) ABSTRACT

A heat treatment apparatus for heating, in a treatment container, a substrate on which a coating film is formed. The heat treatment apparatus includes: a mount provided in the treatment container and which mounts the substrate thereon; a heating part that heats the substrate mounted on the mount; a suction pipe leading to a suction port formed in the mount, penetrating the mount, and extending directly downward; and a collection container provided on a suction path between the suction pipe and a suction mechanism. The collection container is provided directly below the mount in plan view and connected to the suction pipe to collect a sublimate in the treatment container.

17 Claims, 5 Drawing Sheets

(56) References Cited

U.S. PATENT DOCUMENTS

2021/0057238 A1\* 2/2021 Tan ................... H01L 21/67115
2021/0143044 A1\* 5/2021 Oka .................. H01L 21/68721
2021/0287884 A1\* 9/2021 Bolden ............. H01J 37/32834

\* cited by examiner

HEAT TREATMENT APPARATUS AND HEAT TREATMENT METHOD

CROSS REFERENCE TO RELATED APPLICATIONS

This application is based upon and claims the benefit of priority of the prior Japanese Patent Application No. 2019-122961, filed in Japan on Jul. 1, 2019, the entire contents of which are incorporated herein by reference.

BACKGROUND OF THE INVENTION

1. Field of the Invention

This disclosure relates to a heat treatment apparatus and a heat treatment method.

2. Description of the Related Art

Japanese Laid-open Patent Publication No. 2016-115919 discloses a heat treatment apparatus for heat-treating a coating film formed on a substrate, including: a mount provided in a treatment container and configured to mount a substrate thereon; a heating part configured to heat the substrate mounted on the mount; an air supply port provided along a circumferential direction outside of the substrate on the mount in plan view and configured to supply air into the treatment container; an outer peripheral exhaust port provided along the circumferential direction outside of the substrate on the mount in plan view and configured to exhaust air in the treatment container; and a central exhaust port provided above a central portion of the substrate on the mount and configured to exhaust air in the treatment container.

SUMMARY OF THE INVENTION

The technique according to this disclosure suppresses adverse effect by sublimates generated when heating a substrate.

An aspect of this disclosure is a heat treatment apparatus for heating, in a treatment container, a substrate on which a coating film is formed, the heat treatment apparatus including: a mount provided in the treatment container and configured to mount the substrate thereon; a heating part configured to heat the substrate mounted on the mount; a suction pipe leading to a suction port formed in the mount, penetrating the mount, and extending directly downward; and a collection container provided on a suction path between the suction pipe and a suction mechanism, wherein the collection container is provided directly below the mount in plan view and connected to the suction pipe to collect a sublimate in the treatment container.

According to this disclosure, it is possible to suppress adverse effect by sublimates generated when heating a substrate.

DETAILED DESCRIPTION OF THE INVENTION

Conventionally, various treatment solutions such as a resist solution for forming a pattern and SOC for forming a hard mask for enhancing plasma resistance may be applied on a front surface of a semiconductor substrate, for example, a semiconductor substrate such as a semiconductor wafer (hereinafter, may be referred to as a "wafer"). After the application of the treatment solutions, a heat treatment of heating the wafer is performed in a heat treatment apparatus. Such heat treatment needs to uniformly heat an object wafer for ensuring the uniformity of the coating film, and is usually performed with the object wafer mounted on a flat stage or hot plate.

Incidentally, many multilayer stack devices such as 3D-NAND chips are manufactured recently. However, with an increase in number of stacked layers, warpage may be generated in the wafer itself in a process of a series of treatments. If the heat treatment is performed on the wafer, for example, on the hot plate in a state where the warpage is generated, uniform heating cannot be performed, thus affecting uniformity of the film thickness.

Therefore, in the case of mounting the wafer on, for example, the hot plate or the stage and heating the wafer, the heating is performed on the wafer while the warpage of the wafer is being corrected by sucking and attracting the wafer.

However, in the case where the treatment solution applied on the object wafer is, for example, the aforementioned SOC, a large amount of sublimates are generated when heating it. In this event, the atmosphere in a treatment space is being exhausted from above and around the wafer, but air in a suction exhaust system for sucking the wafer is separately exhausted through a suction route penetrating the hot plate. In this case, since the air in the suction exhaust system is sucked at a high exhaust pressure, a suction path is often narrowed, so that the generated sublimates adhere to the inside of the suction path to inhibit the wafer from being suction-held at a desired suction pressure, possibly resulting in that the warpage of the wafer cannot be corrected. If the warpage cannot be corrected, the uniform heating is difficult, thus affecting the uniformity of the film thickness.

The technique according to this disclosure suppresses adhesion of sublimates to a suction path even if the sublimates are generated at the time when heating the wafer with warpage suction-held on a mount such as a hot plate, thereby preventing them from exerting an influence on suction.

Hereinafter, a configuration of a heat treatment apparatus according to an embodiment will be explained referring to the drawings. Note that in this specification, the same codes are given to components having substantially the same functional configurations to omit duplicated explanation.

Figure 1:
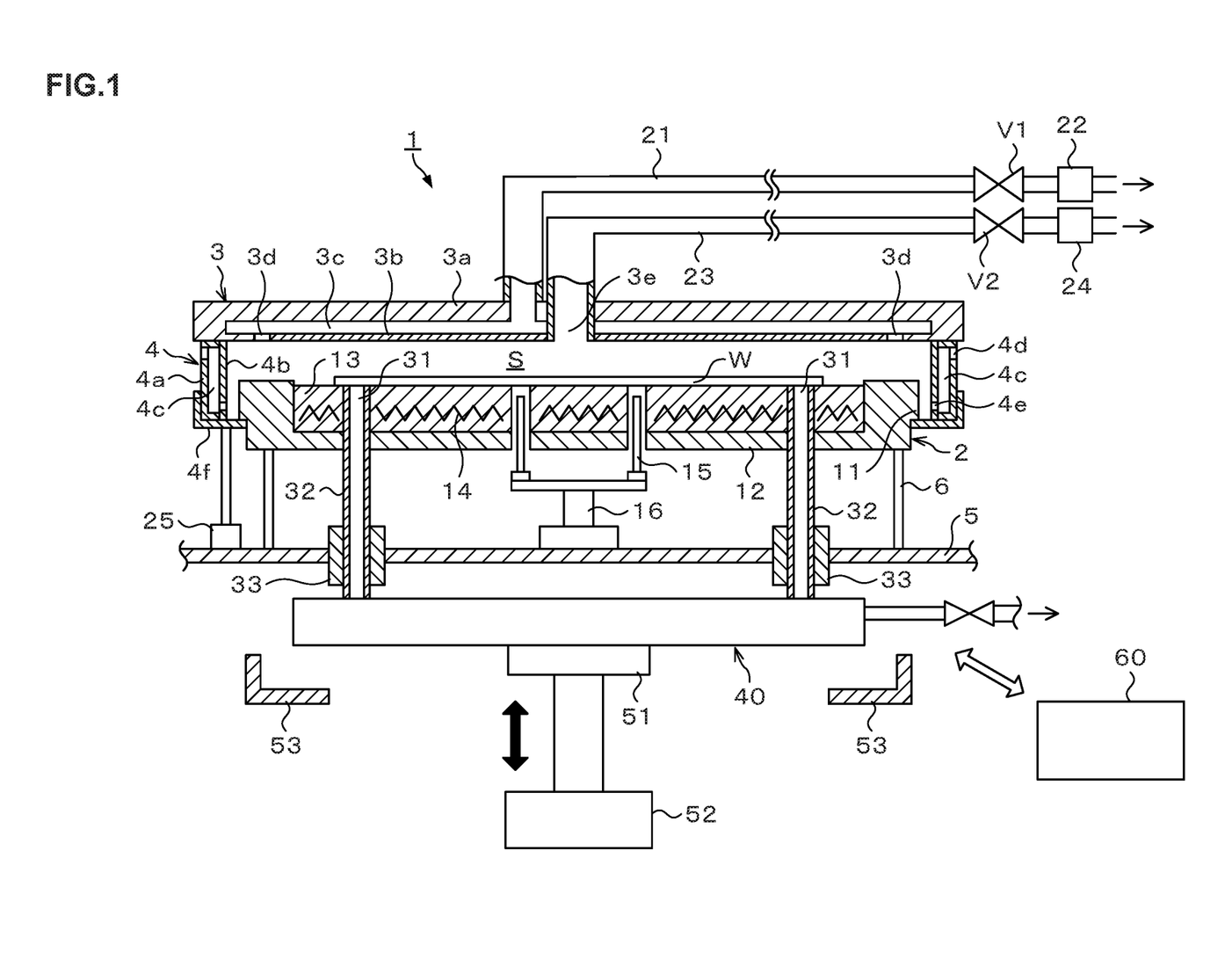
FIG. 1 is an explanatory view schematically illustrating a configuration of a heat treatment apparatus according to this embodiment when viewed from a side.

FIG. 1 illustrates the outline of a configuration of a heat treatment apparatus according to this embodiment. The heat treatment apparatus according to the embodiment of the present invention has a treatment container 1 as illustrated in FIG. 1. The treatment container 1 has a bottom part structure 2 having a bottom part, a lid 3 constituting a ceiling part, and a ring shutter 4 constituting a side surface. The treatment container 1 is provided in a not-illustrated housing.

The bottom part structure 2 is supported via a support member 6 on a base 5 of the not-illustrated housing. The bottom part structure 2 includes a support stage 12 formed with a recessed portion at an inner side of an edge part 11 and composed of a flat cylindrical body. In the recessed portion of the support stage 12, a hot plate 13 being a mount for mounting the wafer W thereon is provided.

In the hot plate 13, a heater 14 being a heating part for performing a heat treatment on the mounted wafer W is provided. Further, for example, three raising and lowering pins 15 penetrating the bottom part structure 2 and delivering the wafer W to/from a not-illustrated external transfer apparatus are provided at equal intervals in a circumferential direction. The raising and lowering pins 15 are configured to be raised by a raising and lowering mechanism 16 provided on the base 5 and able to project to above the hot plate 13.

The lid 3 is composed of a member in a disk shape with a diameter larger than that of the bottom part structure 2. The lid 3 is supported by the ceiling of the aforementioned not-illustrated housing. The lid 3 has such a size that its outer edge is located outside of the outer edge of the bottom part structure 2 in plan view. The lid 3 has a hollow shape, and is formed with an exhaust chamber 3c in a flat cylindrical shape between an upper surface part 3a and a lower surface part 3b.

The exhaust chamber 3c is set such that its outer edge is located at almost the same position as the position of the outer edge of the bottom part structure 2. At a peripheral portion of the lower surface part 3b, a plurality of outer peripheral exhaust ports 3d communicating with the exhaust chamber 3c are formed at equal intervals in the circumferential direction. The outer peripheral exhaust ports 3d are opened at positions outside of the outer edge of the wafer W mounted on the hot plate 13.

An outer peripheral exhaust pipe 21 leading to the exhaust chamber 3c is connected to above the exhaust chamber 3c, namely, to the upper surface part 3a of the lid 3. Assuming that the lid 3 side is the upstream side, the outer peripheral exhaust pipe 21 is provided with a valve V1 and a flow rate regulator 22 from the upstream side, and is connected to a plant exhaust system installed in a plant.

Further, at a central portion of the lower surface part 3b of the lid 3, a central exhaust port 3e is formed. The central exhaust port 3e is opened such that its center is aligned with the center of the wafer W mounted on the hot plate 13. To the central exhaust port 3e, one end side of a central exhaust pipe 23 provided in a manner to penetrate the exhaust chamber 3c is connected. Assuming that the lid 3 side is the upstream side, the central exhaust pipe 23 is provided with a valve V2 and a flow rate regulator 24 from the upstream side, and is connected to the plant exhaust system.

Around the bottom part structure 2, the ring shutter 4 is provided which is a shutter member for closing the periphery of a gap between the bottom part structure 2 and the lid 3 to form a treatment space. The ring shutter 4 is configured to have an annular hollow portion as a whole and has an outside shutter part 4a and an inside shutter part 4b, and an annular space 4c is formed between the outside shutter part 4a and the inside shutter part 4b.

On the upper side of the outside shutter part 4a, inflow ports 4d leading to the annular space 4c are formed at equal intervals over the entire circumference. On the lower side of the inside shutter part 4b, supply ports 4e leading to the annular space 4c are formed at equal intervals over the entire circumference. With this configuration, an inert gas, for example, a nitrogen gas in the housing (not illustrated) housing the treatment container 1 is uniformly supplied into the treatment container 1.

The ring shutter 4 is supported by an annular plate 4f on the lower surface side, and the annular plate 4f is moved up and down by a raising and lowering mechanism 25 provided on the base 5. More specifically, as illustrated in FIG. 1, the ring shutter 4 is raised until the upper side of the inside shutter part 4b bumps into a lower surface outer peripheral portion of the lid 3, to form a treatment space S above the wafer W in the treatment container 1. Alternatively, when the ring shutter 4 is lowered, an entrance and retreat space for a transfer apparatus (not illustrated) for transferring in/out the wafer W is formed so as to transfer in/out the wafer W to/from the hot plate 13.

Note that inside the lid 3 and a wall of the treatment container 1, heaters (not illustrated) are respectively embedded to prevent precipitation of sublimates inside the exhaust chamber 3c and on the wall face, and perform heating to a predetermined temperature, for example, 300° C.

The hot plate 13 has a plurality of, for example, eight suction ports 31 formed at equal intervals at a peripheral portion of its upper surface. To each of the suction ports 31, an upper end portion of a cylindrical suction pipe 32 penetrating the hot plate 13 and the bottom part structure 2 is connected. A lower end portion of each suction pipe 32 penetrates the base 5 and is connectable to a collection container 40 located below the base 5. The collection container 40 is located directly below the hot plate 13 in plan view. At an outer periphery of a portion penetrating the base 5 of the suction pipe 32, a heat insulator 33 is provided.

The collection container 40 is supported by a support stage 51, and the support stage 51 is movable up and down by a raising and lowering mechanism 52. In the state illustrated in FIG. 1, the collection container 40 is located at a position raised by the raising and lowering mechanism 52, namely, at a position where the lower end portion of each of the suction pipes 32 and the collection container 40 are connected. On the other hand, when the support stage 51 is lowered by the raising and lowering mechanism 52, the connection state between the lower end portion of each of the suction pipes 32 and the collection container 40 is released. Below the collection container 40, a receiver 53 is arranged. Accordingly, when the support stage 51 is lowered by the raising and lowering mechanism 52, only the collection container 40 can be mounted on the receiver 53.

Figure 2:
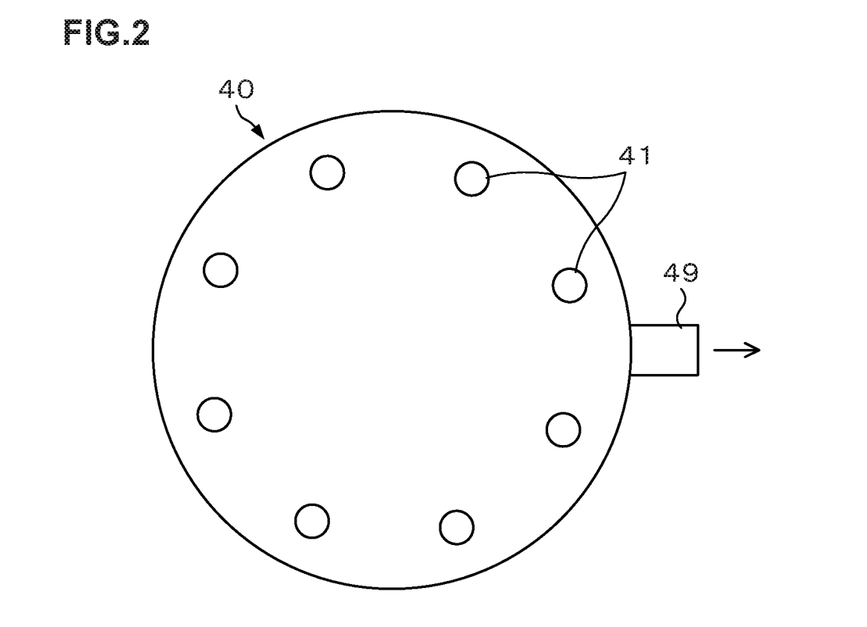
FIG. 2 is a plan view of a collection container employed in the heat treatment apparatus in FIG. 1.
Figure 3:
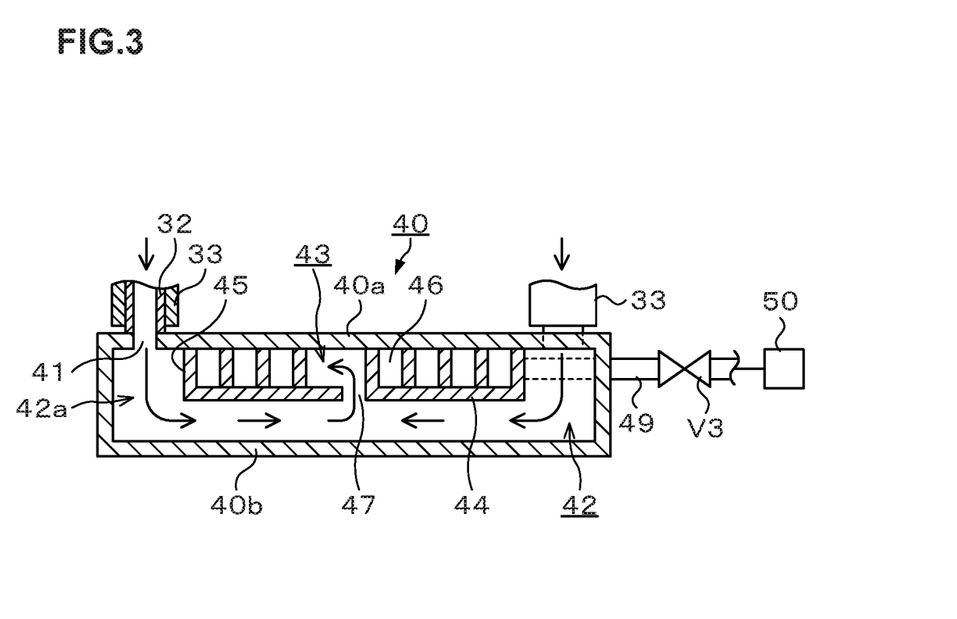
FIG. 3 is a side sectional view of the collection container in FIG. 2.

Next, a detailed structure of the collection container 40 will be explained. As illustrated in FIG. 2 and FIG. 3, connection ports 41 airtightly connected respectively to the lower end portions of the eight suction pipes 32 are formed at equal intervals in the circumferential direction at an upper surface peripheral portion of the collection container 40.

Inside the collection container 40, as illustrated in FIG. 3, a first space 42 relatively small in pressure loss is provided on the lower side, and a second space 43 relatively large in pressure loss is formed on the upper side. The first space 42 has an annular space 42a located directly below the connection ports 41.

Figure 4:
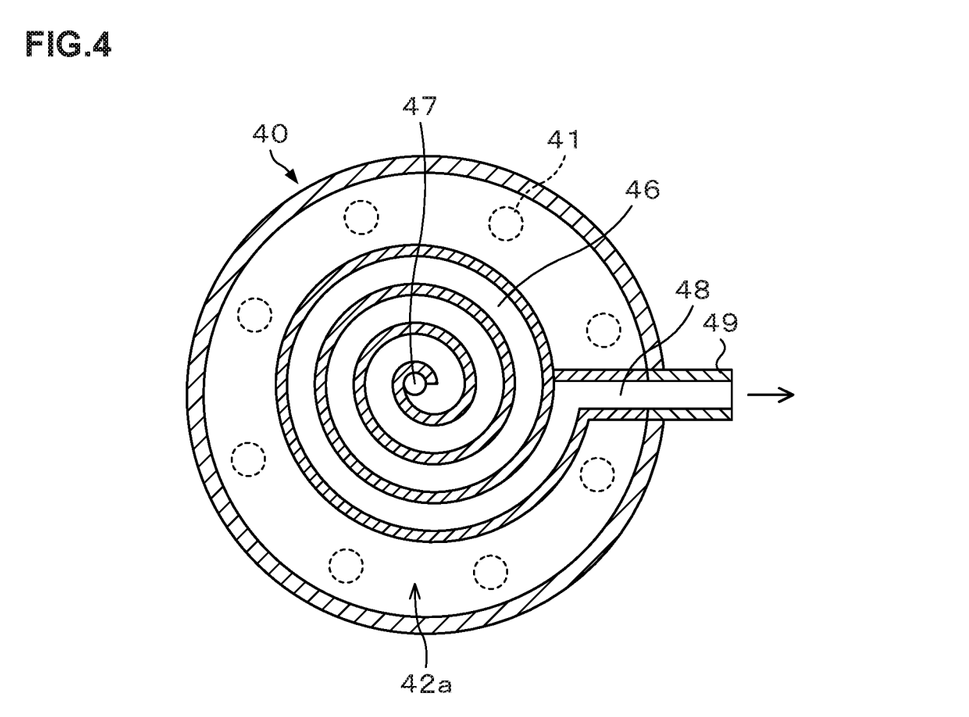
FIG. 4 is a plan sectional view of the collection container in FIG. 2.

On the other hand, the second space 43 is formed into a space surrounded by a bottom plate 44, a side wall 45, and a ceiling plate 40a of the collection container 40, and a spiral flow path 46 extending in a spiral shape from the center to the outer periphery side as illustrated in FIG. 4 is formed on the bottom plate 44. Note that the first space 42 is formed by a bottom plate 40b of the collection container 40, the bottom plate 44, and the side wall 45.

At the center of the bottom plate 44, an inlet 47 leading to the flow path 46 is formed. At a terminal end portion near the outer periphery of the flow path 46, an outlet 48 is formed. To the outlet 48, a suction exhaust pipe 49 extending outside the collection container 40 is connected. The suction exhaust pipe 49 is freely connectable to a valve V3. Assuming that the collection container 40 is the upstream side, the downstream side of the valve V3 leads to a suction mechanism 50 such as an injector or a blower fan. Accordingly, the suction mechanism 50 is operated to form a suction path continuing from the suction ports 31, the suction pipes 32, and the collection container 40 to the suction exhaust pipe 49, the valve V3, and the suction mechanism 50. The suction mechanism 50 has, for example, a pump having a suction function.

The heat treatment apparatus relating to the above configuration is controlled in various operations by a controller 60 composed of a computer as illustrated in FIG. 1. In more detail, the controller 60 has a program storage, and the program storage stores a program configured to issue instructions relating to the mounting of the wafer W onto the hot plate 13 and lifting of the wafer W from the hot plate 13 by lowering and raising of the raising and lowering pins 15, the opening and closing of the ring shutter 4, the heating by the heater 14, the opening and closing of the valves V1, V2, V3, the flow rate regulation of the flow rate regulators 22, 24, the raising and lowering of the collection container 40, and the operation of the suction mechanism 50 and so on. The program may be the one that is stored, for example, in a storage medium such as a flexible disk, compact disk, hard disk, MO (magneto-optical disk), or memory card, and installed into the controller 60.

The heat treatment apparatus according to this embodiment has the above configuration, and its operation and so on will be explained next. In a pre-stage treatment in the heat treatment apparatus, for example, a coating solution containing a precursor of a carbon film is applied to the wafer W to form an SOC film being a coating film. When the wafer W is moved to above the hot plate 13 by the transfer apparatus (not illustrated) in a state where the ring shutter 4 is lowered, the wafer W is delivered to the raising and lowering pins 15 by the cooperative action of the transfer apparatus and the raising and lowering pins 15. At this time, the power of the heater 14 is controlled so that the surface temperature of the hot plate 13 becomes, for example, 350° C. In this event, the collection container 40 is located at the raised position, namely, the collection container 40 is raised as illustrated in FIG. 1 and is in a state where the connection ports 41 of the upper surface of the collection container 40 are connected to the lower end portions of the suction pipes 32. The raised position forms a state capable of sucking the wafer W.

Then, when the wafer W is mounted on the hot plate 13, the valve V3 is opened, so that the wafer W is suction-held on the hot plate 13 by the suction through the suction ports 31. Accordingly, even a wafer W with warpage can be made into a flat state because the warpage is corrected by the suction through the suction ports 31. This enables a uniform heat treatment to be performed on the wafer W.

Note that the suction pressure of the suction mechanism 50 which performs the suction is controllable by adjusting the opening degree of the valve V3 and so on. Accordingly, in the case of sucking the wafer, for example, the case of an initial stage of the heat treatment, the suction force of the suction mechanism 50 may be made relatively strong, whereas the suction force may be made relatively weak or the suction itself may be stopped on the assumption that the SOC film has already been dried and hardened at the later stage of the heat treatment. By controlling the strength of the suction force and the operation itself as above, the suction rate can be reduced.

Then, when the wafer W is suction-held on the hot plate 13, the ring shutter 4 is raised to bring the treatment container 1 into a closed state, whereby the treatment space S is formed in a divided manner. Then, the valves V1, V2 are opened, and the heat treatment is performed on the wafer W in a state where the exhaust through the central exhaust port 3e and the central exhaust pipe 23 and the exhaust through the outer peripheral exhaust ports 3d, the exhaust chamber 3c, and the outer peripheral exhaust pipe 21 are performed.

During the heat treatment, evaporation of a solvent in the SOC film being the coating film on the wafer W is accelerated and a cross-linking reaction proceeds due to a cross-linking agent in the coating film. During this time, the cross-linking agent and low-molecular components in the coating film evaporate, whereas many sublimates are generated in the latter half of the heat treatment. Some of the sublimates are discharged through the above-explained central exhaust port 3e and outer peripheral exhaust ports 3d, whereas the remaining sublimates flow through the gap between the lower surface of the wafer W and the hot plate 13 into the suction ports 31. This is because small projections called gap pins or proximity pins for creating small voids are formed on the surface of the hot plate 13 and the suction force through the suction ports 31 is larger than that of the exhaust from the central exhaust pipe 23 and the outer peripheral exhaust ports 3d.

Then, the sublimates sucked from the suction ports 31 into the suction pipes 32 flow from the connection ports 41 of the collection container 40 through the annular space 42a into the first space 42 as illustrated in FIG. 3. Then, the sublimates flow from the inlet 47 at the center of the bottom plate 44 in the second space 43, come around the spiral flow path 46 to the outer peripheral side, and are exhausted from the outlet 48 through the suction exhaust pipe 49 to the outside.

According to this embodiment, the collection container 40 is installed directly below the hot plate 13 in plan view, and the suction pipes 32 are vertically connected to the collection container 40, so that the gas flow containing the sublimates first collide with the bottom plate 40b in the collection container 40. Accordingly, the sublimates in the gas flow partially precipitate due to the inertial collision with the bottom plate 40b and adhere to the bottom plate 40b.

Then, the gas flow in the first space 42 flows toward the inlet 47 provided at the center of the bottom plate 44 in the second space 43 and flows through the spiral flow path 46. The flow path 46 is formed in a spiral shape and is thus larger in pressure loss than the first space 42, so that the sublimates precipitate or adhere to the inside of the flow path 46 in the process of the gas flow containing the sublimates flowing through the flow path 46. Through the process, most of the sublimates are collected by the collection container 40. In addition, the flow path 46 is formed in a spiral shape, so that the flow path itself can be kept long in the limited space in the collection container 40, thus providing high effect of collecting the sublimates.

Accordingly, it is possible to prevent the sublimates generated during the heat treatment from adhering to the inside of the suction ports 31 and the suction pipes 32 having a small diameter for suction-holding the wafer W and to prevent the sublimates from blocking the ports and pipes. Therefore, also in performing the heat treatment on the coating film in which many sublimates are generated such as the SOC film, the wafer W can be suitably suction-held. Accordingly, even a wafer W with warpage that is a heat treatment object can be made into a flat state by appropriately correcting the warpage by suction-holding the wafer W with warpage through the suction ports 31. Therefore, it is possible to perform a uniform heat treatment on the wafer W with warpage.

Further, in the above embodiment, the suction pipe 32 itself is connected to the hot plate 13 and is at a temperature close to the treatment temperature by heat conduction, so that the sublimates are decomposed at a portion close to the hot plate 13 even if the sublimates adhere to the portion. However, as separated from the hot plate 13, the temperature decreases due to heat dissipation. In particular, at a portion of the suction pipe 32 penetrating the base 5, if the suction pipe 32 penetrates the base 5 as it is, the heat is dissipated to the base 5 and the temperature therefore decreases, so that the sublimates may adhere to the inner periphery of the suction pipe 32. In this embodiment, since the heat insulator 33 is provided at the outer periphery of the suction pipe 32 at the penetrating portion, the heat dissipation is suppressed to suppress adhesion of the sublimates to the inner periphery of the suction pipe 32 at the penetrating portion.

The sublimates when generated during the heat treatment and being sucked through the suction ports 31 are collected by the collection container 40, but when the heat treatment is repeated for a long time, the sublimates collected in the collection container 40 possibly cause a trouble in the suction exhaust itself. Therefore, it is necessary to periodically remove and maintain the collection container 40 or replace the collection container 40 with a new collection container 40.

Figure 5:
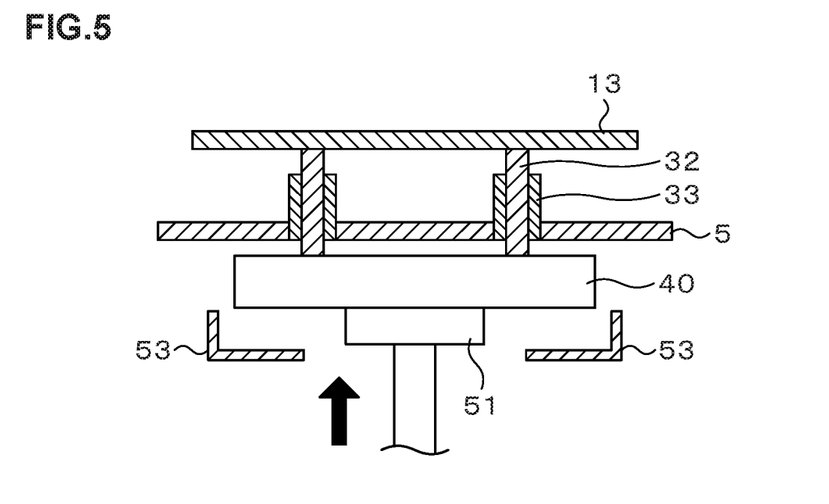
FIG. 5 is an explanatory view illustrating the appearance in a state capable of suction-holding a wafer in the heat treatment apparatus in FIG. 1.
Figure 6:
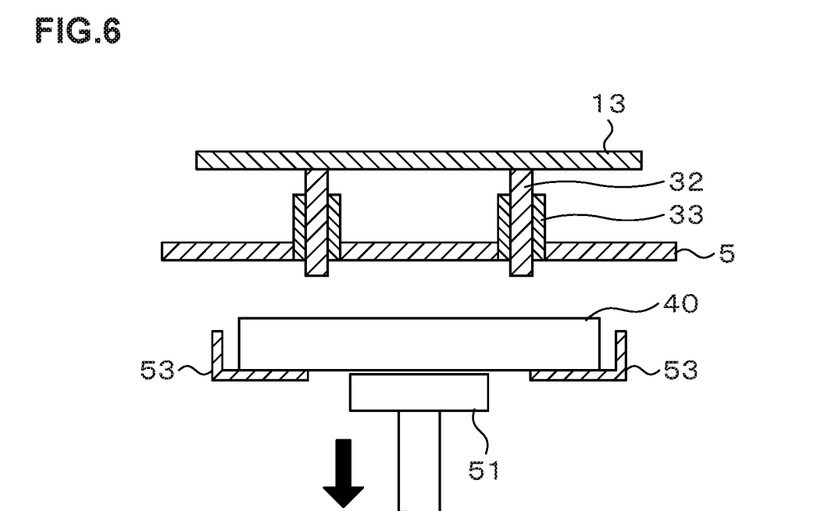
FIG. 6 is an explanatory view illustrating the appearance when releasing the state capable of suction-holding the wafer in the heat treatment apparatus in FIG. 1 to thereby release the connection between a collection container and suction pipes.

Also this case can be appropriately coped with in this embodiment. More specifically, in the state where the wafer W can be suction-held as illustrated in FIG. 1 and FIG. 5, the support stage 51 is pushed upward by the raising and lowering mechanism 52 and the connection ports 41 in the upper surface of the collection container 40 are in a state of being connected to the lower end portions of the suction pipes 32. Accordingly, the connection between the suction exhaust pipe 49 and the valve V3 is released first, the pressing upward of the collection container 40 by the raising and lowering mechanism 52 is released, and the support stage 51 is lowered as illustrated in FIG. 6, whereby the connection between the collection container 40 and the lower end portions of the suction pipes 32 is released, and only the collection container 40 can be mounted on the receiver 53. Therefore, the maintenance and replacement of the collection container 40 is easy. Note that if the suction pipes 32 are configured to be attachable and detachable to/from the hot plate 13, the suction pipes 32 themselves can also be easily separately maintained.

Note that the first space 42 relatively small in pressure loss and the second space 43 relatively large in pressure loss are formed in the collection container 40 in the above embodiment, in which case the second space 43 does not particularly need to be provided with the flow path but may be simply made into a space narrower than the first space 42. Further, not only two spaces but a plurality of spaces different in size may be provided in the vertical direction or the horizontal direction in the collection container 40. As a matter of course, because of the inertial collision of gas flows from the suction pipes 32, the sublimates can be accordingly collected, so that only one space may be formed in the collection container 40.

Further, the flow path 46 itself is not limited to the spiral shape but may be formed into a flow path in a zigzag shape or a flow path in which baffle plates are arranged in a staggered form.

Figure 7:
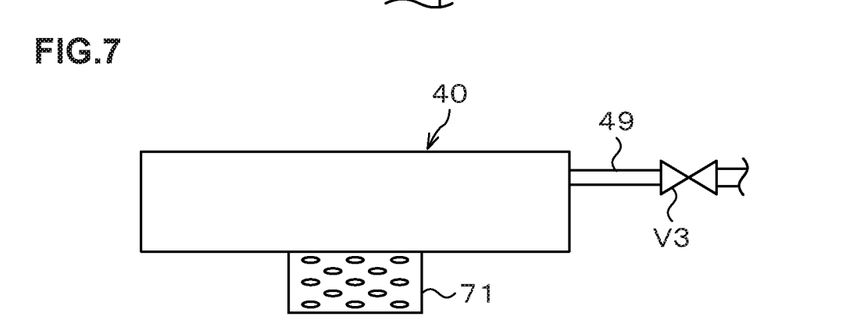
FIG. 7 is an explanatory view illustrating an example in which a heater is provided at the collection container.

Further, as illustrated in FIG. 7, the collection container 40 may be configured such that a heater 71 as a heating mechanism is provided at the collection container 40 in order to actively decompose the sublimates collected in the collection container 40 so that the collected sublimates are decomposed by heating. In this case, it is effective that the hater 71 is provided to heat a region where the gas flow containing the sublimates collides first with the bottom plate 40b in the collection container 40. Further, a catalyst for decomposing the collected sublimates may be provided in the collection container 40.

Figure 8:
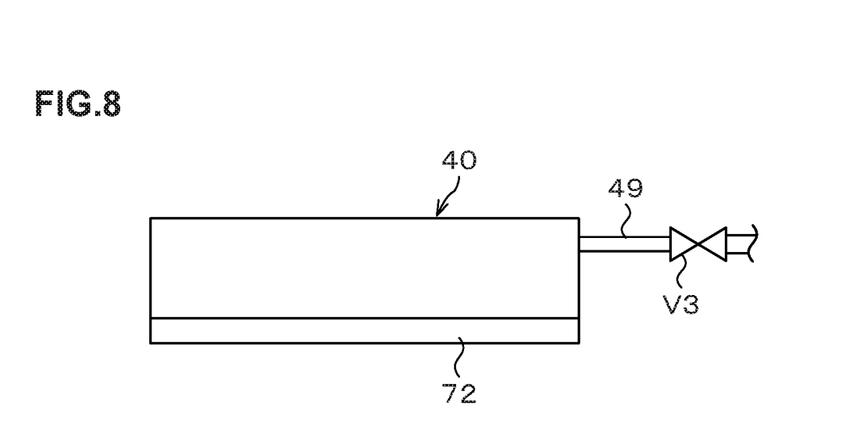
FIG. 8 is an explanatory view illustrating an example in which a cooling plate is attached to a lower surface of the collection container.

Furthermore, as illustrated in FIG. 8, the collection container 40 may be configured such that a cooler 72 is provided on a lower surface side of the collection container 40 to cool the lower surface side in the collection container 40 to actively precipitate the sublimates. An example of the cooler 72 can be a Peltier element which does not require piping for instance. As a matter of course, the cooler may have a configuration through which a refrigerant or cooling water flows.

Next, a heat treatment apparatus according to another embodiment will be explained using FIG. 9. Note that for explanation, portions different from those in the heat treatment apparatus 1 according to the embodiment illustrated in FIG. 1 will be mainly explained, and explanation of common portions will be omitted.

Figure 9:
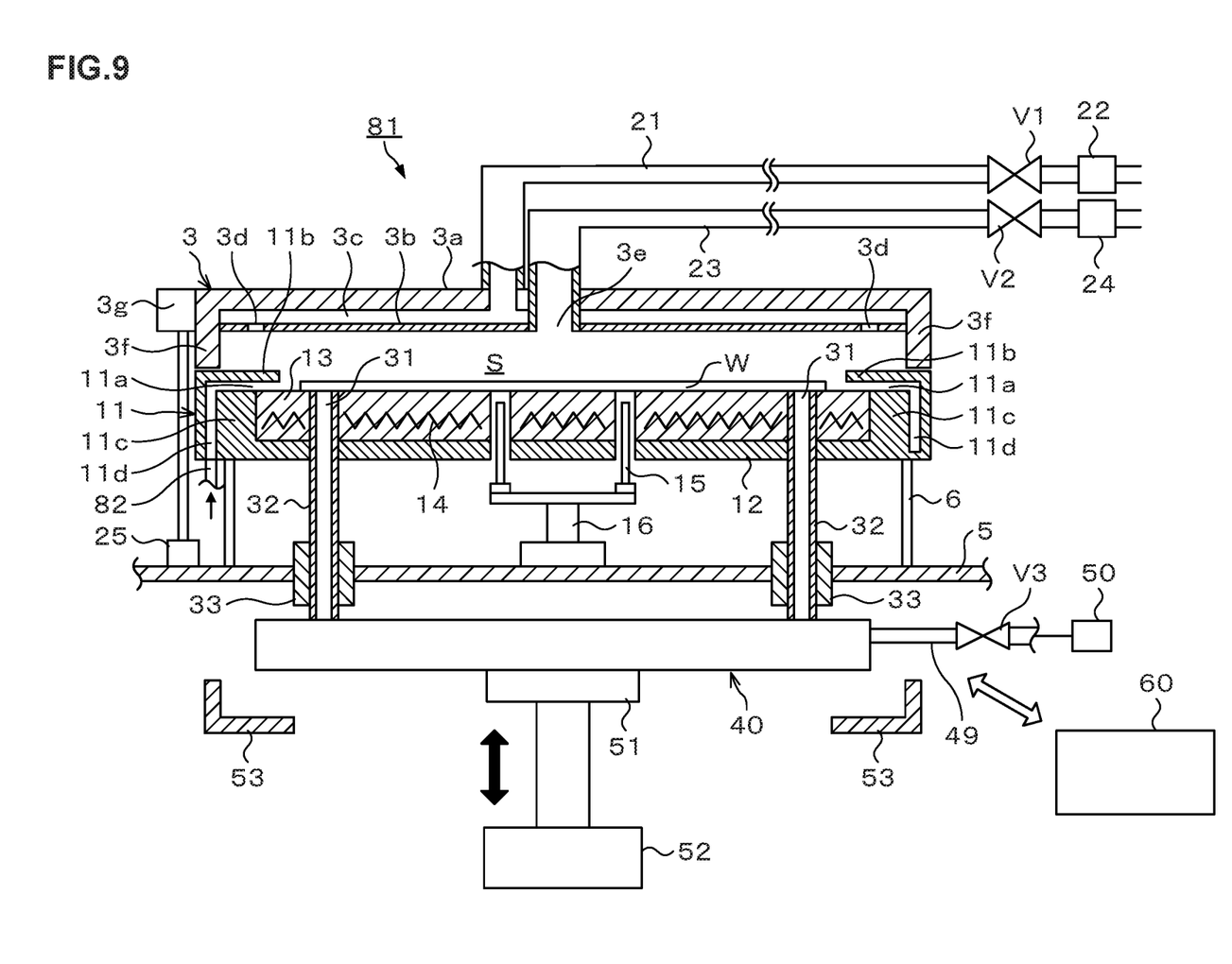
FIG. 9 is an explanatory view schematically illustrating a configuration of a heat treatment apparatus according to another embodiment when viewed from a side.

A heat treatment apparatus 81 illustrated in FIG. 9 is provided with a hanging portion 3f in a circular ring shape, in place of the ring shutter 4, at the outer peripheral end portion of the lid 3. At the outer peripheral portion of the lid 3, a fixing part 3g is provided, and the fixing part 3g and the raising and lowering mechanism 25 are connected. Accordingly, the entire lid 3 is configured to be raised and lowered by the operation of the raising and lowering mechanism 25.

At the edge part 11 located beside the hot plate 13, a gas supply port 11a which supplies gas toward the hot plate 13 is provided in the horizontal direction. The gas supply port 11a in this embodiment is formed between an annular flange part 11b having a size of slightly covering above the peripheral portion of the hot plate 13 and a support portion 11c on the hot plate 13 side of the edge part 11. The flange part 11b constitutes a straightening body. The gas supply port 11a is connected to a gas supply path 82 via a flow path 11d. The gas supply path 82 leads to a supply source (not illustrated) of a dilution gas such as $N_2$, Dry Air or the like.

According to the heat treatment apparatus 81 having the above configuration, supply of the dilution gas from the gas supply port 11a toward the wafer W on the hot plate 13 can decrease the concentration of the sublimates in the atmosphere below the wafer W. More specifically, as has been explained, small projections such as gap pins or proximity pins for creating small voids are formed on the surface of the hot plate 13, so that when sucking from the suction ports 31, small voids are formed between the wafer W and the hot plate 13.

Accordingly, by supply of the dilution gas from the gas supply port 11a toward the wafer W, the dilution gas enters the small voids when the wafer W is sucked and thereby can decrease the concentration of the sublimates in the atmosphere below the wafer W. This can prevent the suction ports 31, the suction pipes 32, and the suction flow path and so on inside the collection container 40 from being clogged with the sublimates.

Further, the gas supply port 11a is provided on the side lower than the upper surface of the wafer W mounted on the hot plate 13 to direct the supply direction to the side lower than the upper surface of the wafer W and thereby prevents the dilution gas supplied from the gas supply port 11a from interfering with the gas flow on the wafer W, thus suppressing the effect on the heat treatment. Further, the flange part 11b is provided as the straightening body on the upper side of the gas supply port 11a, so that the dilution gas to be supplied is straightened by the flange part 11b and further prevented from interfering with the gas flow on the wafer W.

The embodiments disclosed herein are only examples in all respects and should not be considered to be restrictive. The above embodiments may be abbreviated, replaced, or changed in various forms without departing from the scope and spirit of the claims

What is claimed is:

1. A heat treatment apparatus for heating, in a treatment container, a substrate on which a coating film is formed, the heat treatment apparatus comprising:
    a mount provided in the treatment container and configured to mount the substrate thereon;
    a heating part configured to heat the substrate mounted on the mount;
    a suction pipe leading to a suction port formed in the mount, penetrating the mount, and extending directly downward, wherein the suction port is formed in an area overlapped with the substrate on the mount in plan view and connected to a suction mechanism configured to generate a suction force for suction-holding the substrate to the mount; and
    a collection container provided on a suction path between the suction pipe and the suction mechanism,
    wherein the collection container is provided directly below the mount in plan view and connected to the suction pipe to collect a sublimate in the treatment container.

2. The heat treatment apparatus according to claim 1, wherein
    the collection container is freely connectable to and removable from the suction pipe.

3. The heat treatment apparatus according to claim 1, wherein
    a flow path configured to increase a pressure loss when a gas flow from the suction pipe flows is provided in the collection container.

4. The heat treatment apparatus according to claim 1, wherein
    the collection container comprises:
    a first space through which a gas flow from the suction pipe flows first and which is relatively small in pressure loss; and
    a second space which communicates with the first space and is relatively larger in pressure loss than the first space.

5. The heat treatment apparatus according to claim 1, wherein:
    the collection container has a plurality of connection ports connected with a plurality of the suction pipes and formed in a circumferential direction; and
    a spiral flow path, which is formed on a side closer to a center than the plurality of connection ports and communicates with the connection ports, is provided in the collection container.

6. The heat treatment apparatus according to claim 1, further comprising
    a raising and lowering mechanism configured to raise and lower the collection container to thereby connect and disconnect the collection container and the suction pipe.

7. The heat treatment apparatus according to claim 6, further comprising
    a receiver capable of mounting the collection container thereon at a position where the collection container lowered from a position where the collection container has been connected with the suction pipe is disconnected from the suction pipe.

8. The heat treatment apparatus according to claim 1, wherein
    the collection container comprises a heater configured to heat the collection container.

9. The heat treatment apparatus according to claim 1, wherein
    the collection container comprises a cooler configured to cool the collection container.

10. The heat treatment apparatus according to claim 1, wherein
    the collection container comprises a catalyst configured to decompose the collected sublimate.

11. The heat treatment apparatus according to claim 1, further comprising
    a gas supply port provided beside the substrate mounted on the mount and configured to supply gas to between the substrate and the mount.

12. The heat treatment apparatus according to claim 11, wherein
    the gas supply port is provided at a position lower than an upper surface of the substrate mounted on the mount.

13. The heat treatment apparatus according to claim 11, further comprising
    a straightening body provided on an upper side of the gas supply port and extending toward the mount side.

14. The heat treatment apparatus according to claim 1, further comprising
    a controller configured to control the suction mechanism, the controller controlling the suction mechanism so as to weaken suction force at a later stage of heating the substrate.

15. A heat treatment method for performing a heat treatment on a substrate on which a coating film is formed, in a state where the substrate is mounted on a mount in a treatment container, the method comprising:
    suction-holding, at a time of the heat treatment, the substrate by suction from a suction port of the mount; and
    collecting a sublimate generated in the heat treatment in a suction path continuing from the suction port in the treatment container, by a collection container arranged directly below the mount in plan view.

16. The heat treatment method according to claim 15, further comprising
    weakening suction force through the suction port at a later stage of the heat treatment.

17. The heat treatment method according to claim 15, wherein
a dilution gas for decreasing a sublimate concentration is supplied to a gap between the substrate to be subjected to the heat treatment and the mount.

* * * * *